(12) United States Patent
Zerbe et al.

(10) Patent No.: US 11,736,111 B2
(45) Date of Patent: *Aug. 22, 2023

(54) DETECTING POWER SUPPLY NOISE EVENTS AND INITIATING CORRECTIVE ACTION

(71) Applicant: Apple Inc., Cupertino, CA (US)

(72) Inventors: Jared L. Zerbe, Woodside, CA (US); Brian S. Leibowitz, San Francisco, CA (US); Sanjay Pant, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/455,338

(22) Filed: Nov. 17, 2021

(65) Prior Publication Data

US 2022/0140833 A1 May 5, 2022

Related U.S. Application Data

(63) Continuation of application No. 16/803,861, filed on Feb. 27, 2020, now Pat. No. 11,184,012, which is a continuation of application No. 15/419,218, filed on Jan. 30, 2017, now Pat. No. 10,581,440.

(60) Provisional application No. 62/395,801, filed on Sep. 16, 2016.

(51) Int. Cl.
*H03L 7/099* (2006.01)
*H03L 7/08* (2006.01)
*H03L 1/00* (2006.01)

(52) U.S. Cl.
CPC ............... *H03L 7/099* (2013.01); *H03L 1/00* (2013.01); *H03L 7/0805* (2013.01)

(58) Field of Classification Search
CPC .......................... H03L 1/00; G01R 19/16533
See application file for complete search history.

(56) References Cited

U.S. PATENT DOCUMENTS

| | | | |
|---|---|---|---|
| 5,138,325 | A | 8/1992 | Koury |
| 7,199,672 | B2 | 4/2007 | Munker et al. |
| 7,965,068 | B2 | 6/2011 | Tobin et al. |
| 8,358,931 | B2 | 1/2013 | Siepmann |
| 8,531,245 | B2 | 9/2013 | Joubert et al. |
| 8,803,499 | B2 | 8/2014 | Sreenivas et al. |

(Continued)

*Primary Examiner* — Diana J. Cheng
(74) *Attorney, Agent, or Firm* — Kowert, Hood, Munyon, Rankin & Goetzel, P.C.; Michael B. Davis; Dean M. Munyon

(57) ABSTRACT

Techniques are disclosed relating to detecting supply voltage events and performing corrective actions. In some embodiments, an apparatus includes sensor circuitry and control circuitry. In some embodiments, the sensor circuitry is configured to monitor supply voltage from a power supply and detect a load release event that includes an increase in the supply voltage that meets one or more pre-determined threshold parameters. In some embodiments, the control circuitry is configured to increase clock cycle time for operations performed by circuitry powered by the supply voltage during a time interval, wherein the time interval corresponds to ringing of the supply voltage that reduces the supply voltage and results from the load release event. In some embodiments, the disclosed techniques may reduce transients in supply voltage (which may avoid equipment damage and computing errors) and may allow for reduced voltage margins (which may reduce overall power consumption).

21 Claims, 10 Drawing Sheets

(56) References Cited

U.S. PATENT DOCUMENTS

| | | |
|---|---|---|
| 8,907,643 B2 | 12/2014 | Sreenivas et al. |
| 9,092,210 B2 | 7/2015 | Rotem et al. |
| 9,106,340 B2 | 8/2015 | Siepmann |
| 2006/0145776 A1 | 7/2006 | Shi et al. |
| 2014/0247076 A1 | 9/2014 | Cooke |

DETECTING POWER SUPPLY NOISE EVENTS AND INITIATING CORRECTIVE ACTION

This application is a continuation of U.S. application Ser. No. 16/803,861, filed Feb. 27, 2020 (now U.S. Pat. No. 11,184,012), which is a continuation of U.S. application Ser. No. 15/419,218, filed Jan. 30, 2017 (now U.S. Pat. No. 10,581,440), which claims priority to U.S. Provisional Appl. No. 62/395,801, filed Sep. 16, 2016; the disclosures of each of the above-referenced applications are incorporated by reference herein in their entireties.

BACKGROUND

Technical Field

This disclosure relates generally to power control for circuits and more particularly to performing a corrective action in response to certain detected supply voltage conditions.

Description of the Related Art

Computing devices (especially mobile devices) sometimes operate with high current loads, e.g., when multiple components are working at the same time. When a large current demand occurs, a significant drop in supply voltage may occur, potentially causing a supply voltage undershoot and ringing in the supply voltage. When one or more components are no longer used, a load release event may occur, resulting in a transient voltage spike before the power supply can adjust. This rapid voltage increase may then cause a subsequent ringing and undershoot in supply voltage, e.g., due to the inductive and capacitive characteristics of an integrated circuit. Either the voltage during the initial undershoot or the undershoot caused by a load release may correspond to the worst-case supply voltage in the system, since load releases occur in a high-load scenario where the supply voltage has already drooped.

SUMMARY

Techniques are disclosed relating to detecting supply voltage events and performing corrective actions. In some embodiments, an apparatus includes sensor circuitry and control circuitry. In some embodiments, the sensor circuitry is configured to monitor supply voltage from a power supply. In some embodiments, the sensor circuitry is configured to detect a load step or load release event that includes a decrease or an increase in the supply voltage that meets one or more pre-determined threshold parameters.

One of more of various sensors disclosed herein and/or other types of sensors may be used to detect the load step or load release event. In some embodiments, a sensor includes multiple comparators configured to compare supply voltage to different reference voltage and is configured to detect supply voltage events by tracking comparator outputs over multiple clock cycles. In some embodiments, a programmable sensor complex includes one or more high-pass filters, one or more low-pass filters, and one or more programmable level-sense elements. In some embodiments, a sensor includes a replica of voltage-controlled oscillator (VCO) delay stages (e.g., where the VCO has a separate power supply and the replica is powered by the supply voltage being measured) and is configured to measure phase differences between the VCO and the replica to detect changes in the supply voltage.

In some embodiments, the control circuitry is configured to increase clock cycle time for operations performed by circuitry powered by the supply voltage during a time interval, wherein the time interval corresponds to ringing of the supply voltage that reduces the supply voltage and results from the load release event. The corrective action itself may also control the ringing of the supply voltage by affecting the frequency of the clock. In some embodiments, the corrective action avoids logic timing failures corresponding to the worst case supply voltage droop.

In some embodiments, a power supply mode with a low load line, in some embodiments less than 5 mOhms, is used to control relatively lower-frequency voltage events while adjustments in clock frequency are used to control relatively higher-frequency voltage events. The lower values of load line mode may increase average supply voltage (relative to a high load line) during high current loads while the adjustments in clock frequency may control the impact of increased transients from the low load line mode.

In some embodiments, the disclosed techniques may reduce transients in supply voltage (which may avoid equipment damage and critical path failures or computing errors) and may allow for reduced voltage margins (which may reduce overall power consumption).

Figure 1:
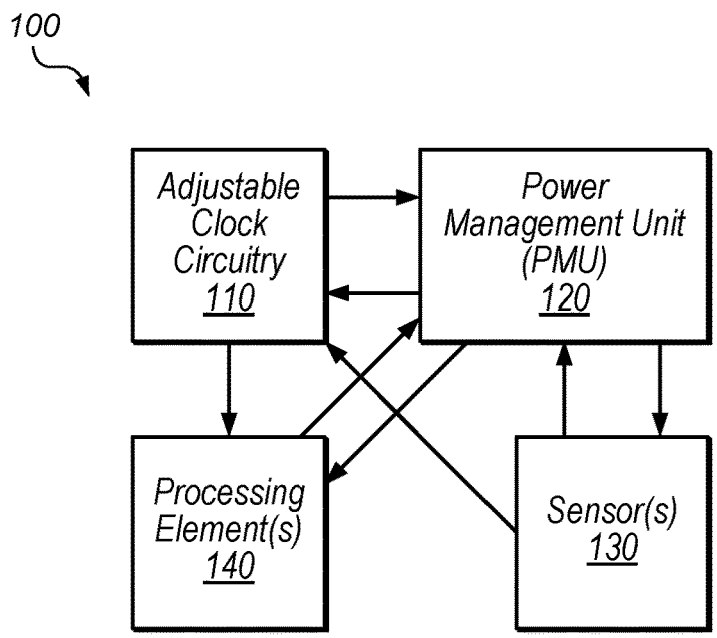
FIG. 1 is a block diagram illustrating one embodiment of a device that includes a power management unit, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

DETAILED DESCRIPTION

Figure 2:
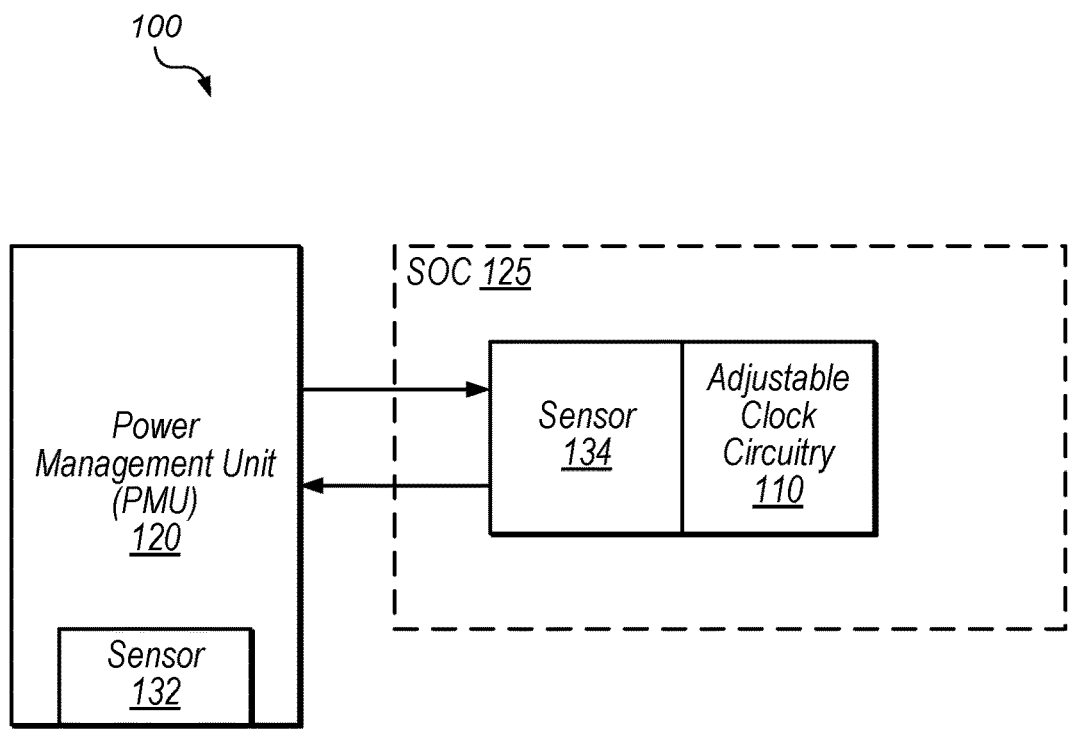
FIG. 2 is a block diagram illustrating exemplary sensor locations, according to some embodiments.
Figure 3A:
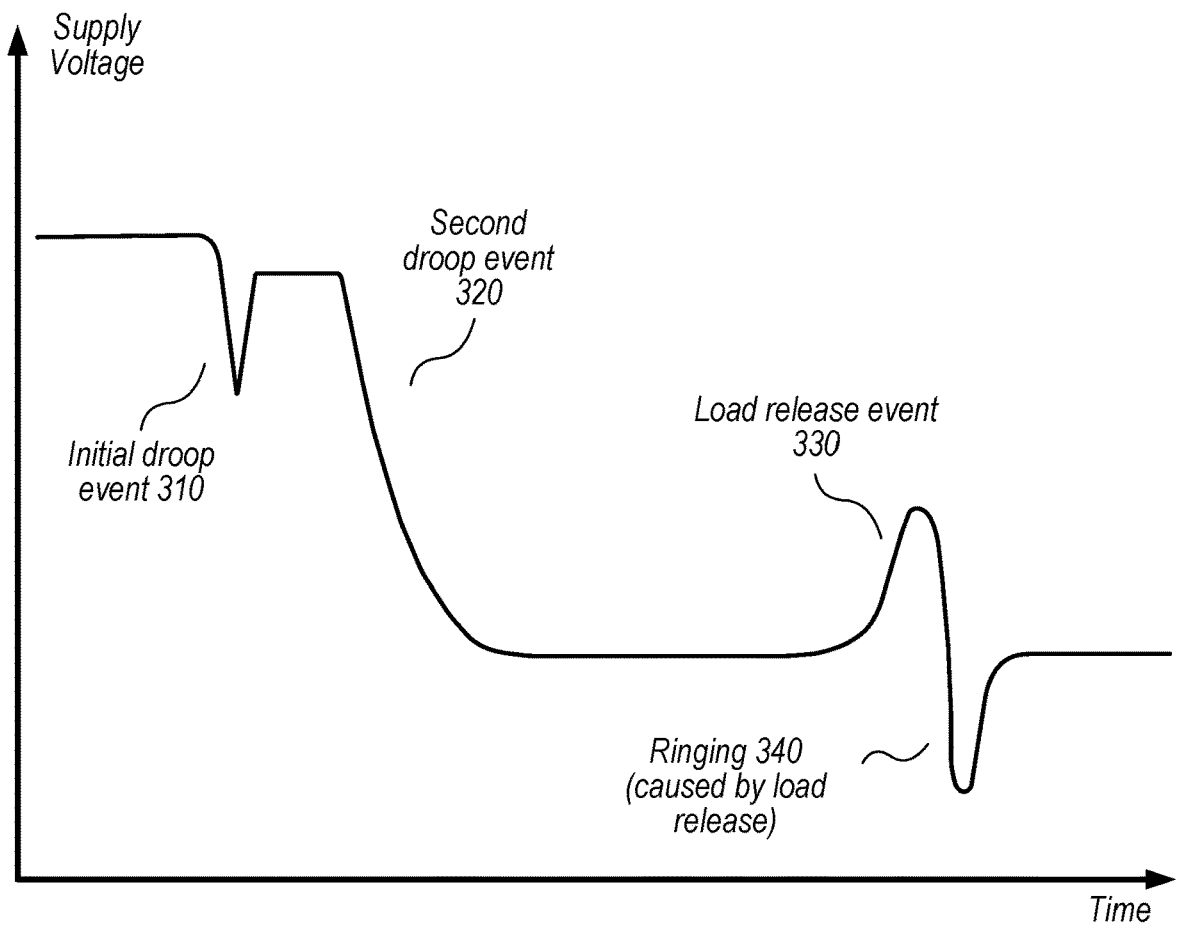
FIG. 3A is an exemplary plot of supply voltage over time that shows a load release event, according to some embodiments.
Figure 3B:
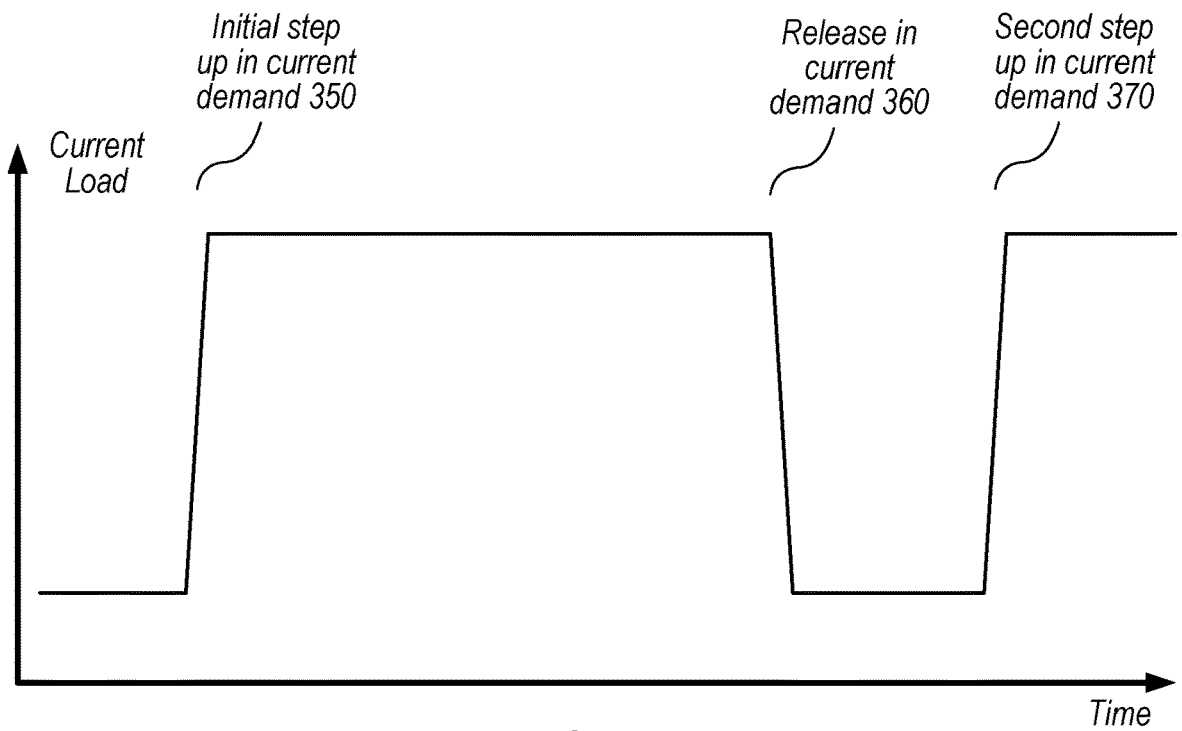
FIG. 3B is an exemplary plot of current demand over time corresponding to the interval shown in FIG. 3A, according to some embodiments.
Figure 9:
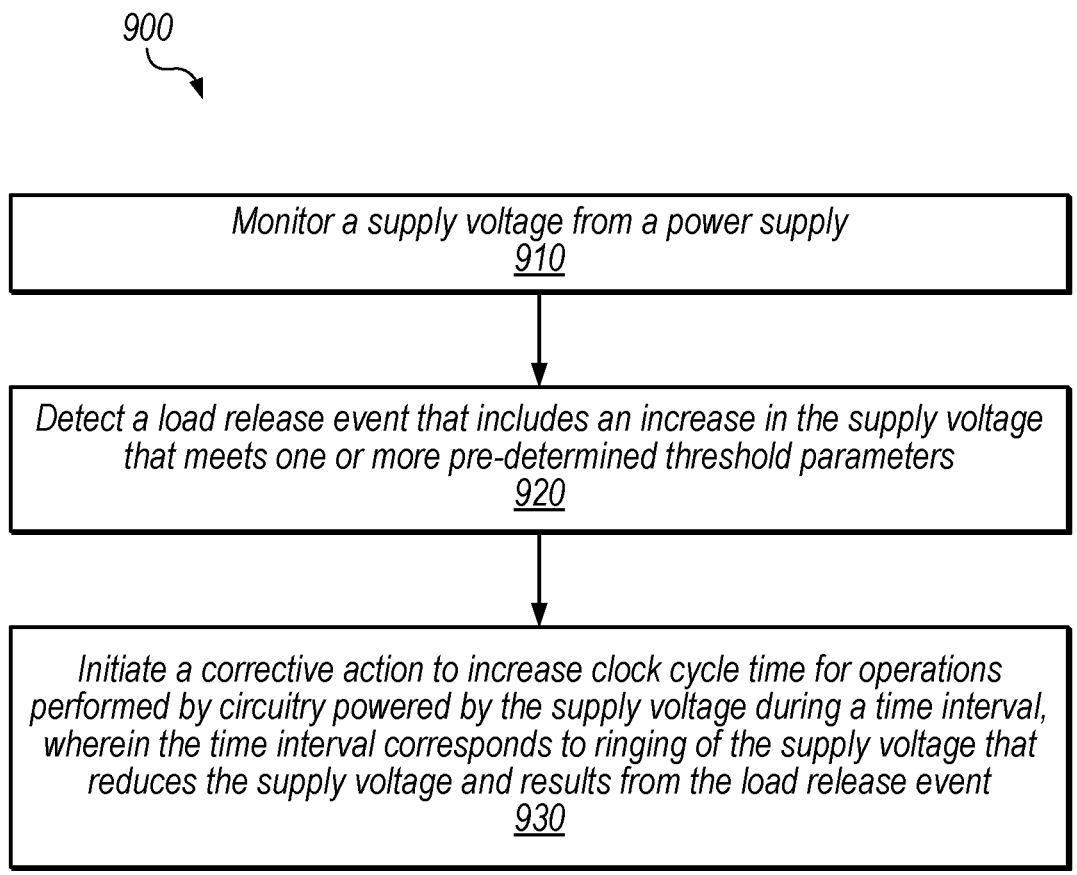
FIG. 9 is a flow diagram illustrating a method for detecting and handling a load release event, according to some embodiments.
Figure 10:
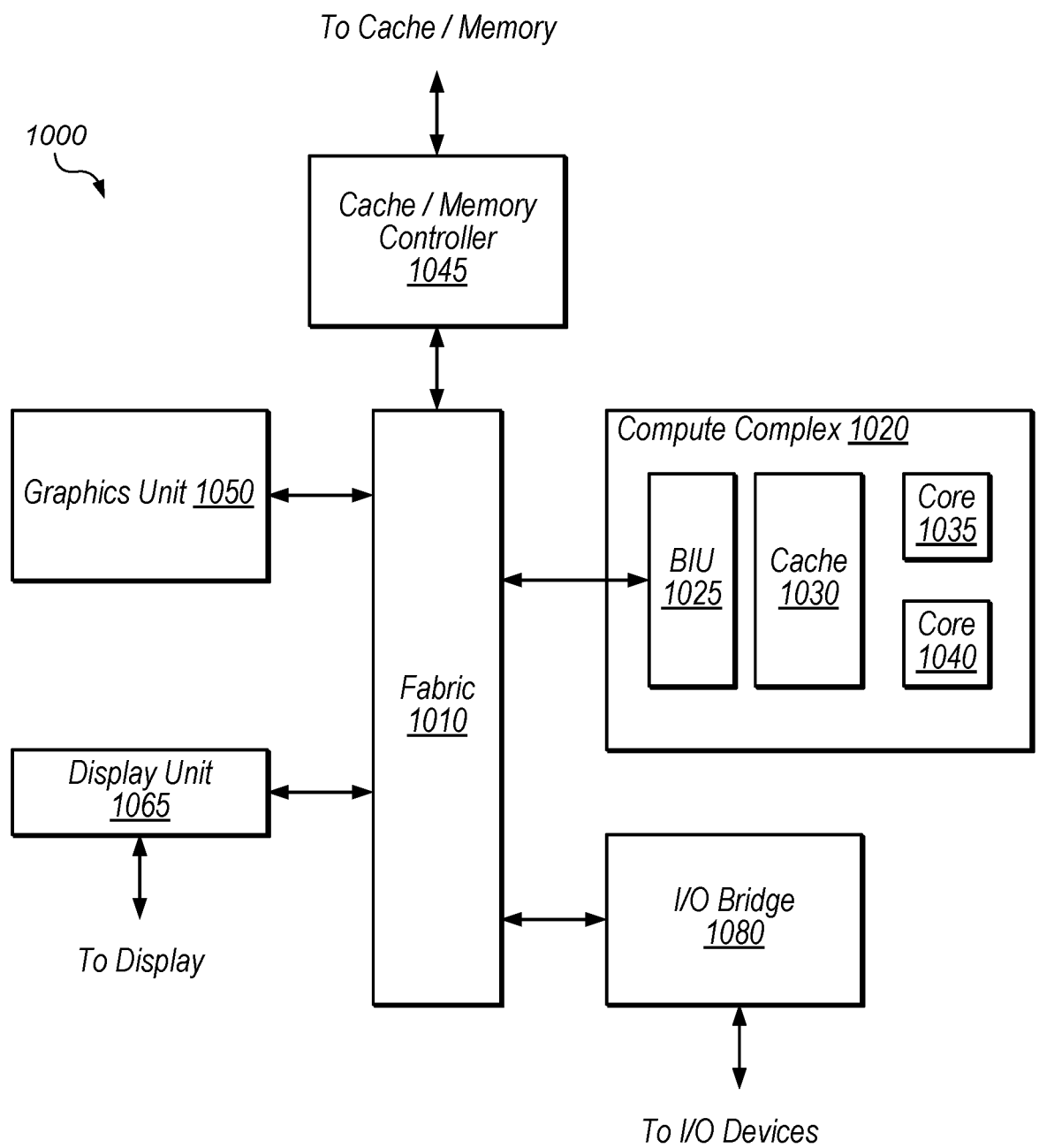
FIG. 10 is a block diagram of an exemplary device, according to some embodiments.
Figure 11:
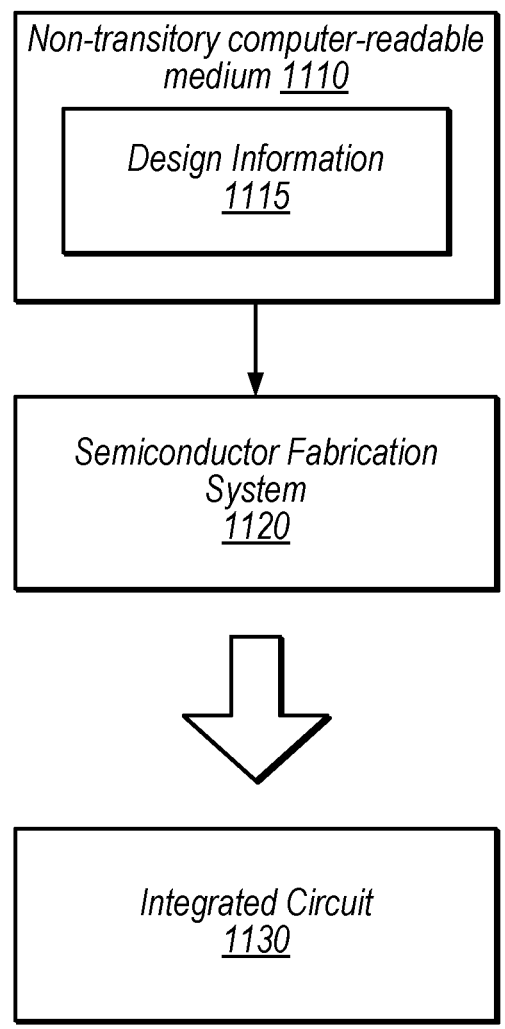
FIG. 11 is a block diagram illustrating an exemplary computer-readable medium that stores circuit design information, according to some embodiments.

This disclosure initially describes, with reference to FIGS. 1-2, an exemplary device that includes various sensors configured to monitor supply voltage. FIGS. 3A-3B show exemplary plots of supply voltage and current load that include a load release event. Exemplary embodiments of sensors are discussed with reference to FIGS. 4-6. Techniques that combine a low load line power supply mode with clock frequency downshifting are discussed with reference to FIGS. 7-8. FIG. 9 shows an exemplary method for detecting a load release event and taking corrective action. FIG. 10 shows an exemplary device and FIG. 11 shows an exemplary computer-readable medium. In some embodiments, the disclosed techniques may reduce transients in supply voltage (which may avoid equipment damage and computing errors) and may allow for reduced voltage margins (which may reduce overall power consumption).

Exemplary Power Management Unit (PMU)

FIG. 1 is a block diagram illustrating an exemplary device 100 that is configured to perform various operations to control a supply voltage, according to some embodiments. In the illustrated embodiment, device 100 includes adjustable clock circuitry 110, power management unit (PMU) 120, sensor(s) 130, and processing element(s) 140. In some embodiments, PMU 120 is configured to rapidly adjust the frequency of adjustable clock circuitry 110 in order to respond to changes in supply voltage, which may be caused by changes in current draw by from processing element(s) 140 and detected by one or more of sensor(s) 130, for example. In some embodiment, sensor(s) 130 may directly control adjustable clock circuitry 110 which may reduce response time latency. In some embodiments, one or more sensor(s) 130 may be included in PMU 120 or adjustable clock circuitry 110.

PMU 120 may be configured to initiate any of various appropriate corrective actions in response to detecting voltage situations via sensor(s) 130. Adjusting the frequency of adjustable clock circuitry 110 is discussed herein to facilitate explanation of some embodiments, but is not intended to limit the scope of the present disclosure. Other corrective actions include clock gating or powering down portions of processing element(s) 140, adjusting one or more parameters of a voltage supply, etc.

Sensor(s) 130 may include one or more filters to detect particular types of voltage fluctuations (e.g., high-pass filters to detect transients and low-pass filters to detect longer-term voltage droops under high current loads). More detailed exemplary sensor embodiments are discussed below with reference to FIGS. 4-6.

Processing element(s) 140, in some embodiments, are configured to perform various operations, e.g., based on execution of program instructions. Processing element(s) 140 may include central processing units (CPUs), graphics processors, wireless communication elements (e.g., cellular radios or WLAN radios), display elements, etc. Unused circuitry for a given workload or task may be clock gated or powered down during operation of other circuitry. Therefore, the current load imposed on the power supply of device 100 may vary significantly based on the set of processing element(s) 140 that is currently operating and the frequencies at which it these processing elements are clocked.

Adjustable clock circuitry 110, in some embodiments, is configured to perform rapid, open-loop downshifting to decrease its output frequency in response to control signaling from PMU 120. U.S. patent application Ser. No. 15/146, 374, filed May 4, 2016, which is incorporated by reference herein in its entirety, discusses various implementations of asynchronous shift circuitry configured to adjust the output frequency of an oscillator in response to control signals. Any of these techniques may be implemented by circuitry disclosed herein, among others.

The PMU 120 may or may not be located on the same integrated circuit as the other elements of device 100. Further, sensor(s) 130 may be located in one or more of various locations, including other elements of device 100 (not shown). In some cases, other integrated circuit paths may be configured to translate sensor events into clock frequency downshifts without using PMU 120. PMU 120 is shown as one example of control circuitry but is not intended to limit the scope of the present disclosure.

FIG. 2 is a block diagram illustrating an exemplary configuration in which a sensor 132 is included in PMU 120 while adjustable clock circuitry 110 and a sensor 134 are included in a separate system-on-a-chip (SOC) 125. In this example, the SOC 125 may include processing elements 140 such as those described above. FIG. 2 is included for purposes of illustration, but is not intended to limit the scope of the present disclosure. Rather, FIG. 2 is one of many implementations in which sensors are included in different elements, integrated circuits, devices, etc.

Exemplary Load Release Event

FIG. 3A is a diagram illustrating an exemplary plot of supply voltage over time, according to some embodiments. FIG. 3B is a diagram illustrating an exemplary plot of current load over time (e.g., during the same time interval as FIG. 3A), according to some embodiments. The illustrations are idealized, to facilitate illustration and highlight certain characteristics of an exemplary system. In most circumstances, the plot would have more noise in the supply voltage and current demand. In the illustrated embodiment, the load release event is preceded by other events, which are pre-determined to precede load releases. For example, a given circuit design will typically have characteristic patterns of supply voltage events. In the illustrated example, an initial droop event 310 is followed by a second, more substantial droop event 320 (in response to the initial step up in current demand 350), which is then followed by the load release event 330 (in response to the release in current demand 360). These correlate to an initial step up in current demand, which causes the initial droop 310 and the following second droop 320 due to reaction of passive components and PMU elements of the system. Prior to the load release event 330, the current load may be near its maximum value for the particular circuit design, e.g., a significant percentage of the peak allowed current may be engaged. In other exemplary systems, the magnitude of events 310-370 may be different relative to each other such that the minimum voltage experienced by the system may occur at any of various different points relative to the illustrated events.

As used herein, the term "load release event" is intended to be construed according to well-understood meaning in the art, which includes a rapid decrease on a current load on a power supply relative to the power supply's ability to adjust its output power, causing a sudden increase in supply voltage. Load release events may be caused by clock gating, a memory stall, or powering down a component, for example, which quickly reduces the current load, or due to other short-term variations in active current consumption. This is a high-frequency event, in various embodiments, e.g., when a high-frequency clock is suddenly gated on a particular clock edge. In the illustrated embodiment, the current load may return shortly after the load release event, such as when a memory stall has been cleared causing the voltage to return to a substantially low DC value after the event.

In the illustrated example, the positive increase in supply voltage caused by the load release is followed by a high-frequency ringing 340 in supply voltage that leads to a decrease in supply voltage (that undershoots below the level prior to the increase) that is a result of the load release. As used herein, the term "ringing" is intended to be construed according to its well-understood meaning in the art, which includes the high-frequency response of a signal that results from a high-frequency increase in the signal in the other direction. This may be caused by resonance in capacitance and inductance in the power delivery network, such that a high-frequency positive perturbation results in an opposite negative perturbation. Because the device is under high current load prior to the load release event and the voltage has drooped, the undershoot corresponding to ringing 340 may correspond to the worst-case supply voltage of the device. Therefore, reducing or eliminating the ringing subsequent to a load release may prevent damage to the device and/or may allow for reductions in voltage margins.

Therefore, in some embodiments, device 100 is configured to detect load release event 330 and initiate a corrective action to increase cycle time for circuitry powered by the supply voltage and/or control the resulting ringing and undershoot in supply voltage. In some embodiments, the corrective action is reduction in frequency of adjustable clock circuitry 110, which is performed quickly enough that the circuitry clock by adjustable clock circuitry 110 begins drawing less current (relative to operation at the previous frequency) prior to the ringing. This may reduce the downward transient in the supply voltage, in some embodiments. In some situations or embodiments, the reduction in frequency of adjustable clock circuitry 110 simply gives more time to critical paths contained within processing elements 140, allowing for improved operating margins while in other situations the magnitude of the downward transient may also be reduced.

In some embodiments, a high-pass analog voltage sensor or a slope detector is used to detect one or more of the supply voltage events of FIG. 3A, among other types of events. High-pass filter embodiments may ensure that slower increases in voltage (e.g., with a smaller change in supply voltage over time) do not trigger the corrective action that is used for load release events. Such sensors may be implemented using any of various appropriate techniques. Exemplary embodiments of voltage sensors are discussed below. In some embodiments, multiple sensors are used in combination to detect a predetermined sequence of supply voltage events that precede an undershoot event. In some embodiments, multiple sensors in combination may be used to detect conditions (such as an already low steady-state value of supply voltage) that may cause a ringing event such as event 340 to be particularly harmful to critical paths.

Although a load release event is discussed herein for purposes of explanation, similar techniques may be used for other types of events. For example, high dV/dt voltage transients in either the positive or negative direction that are not caused by a load release may be similarly detected and handled. In the illustrated embodiment, a second step up in current demand 370 subsequent to the load release event keeps the supply voltage in FIG. 3A at a low steady state value subsequent to the load release event.

Exemplary Sensor Implementations

Figure 4:
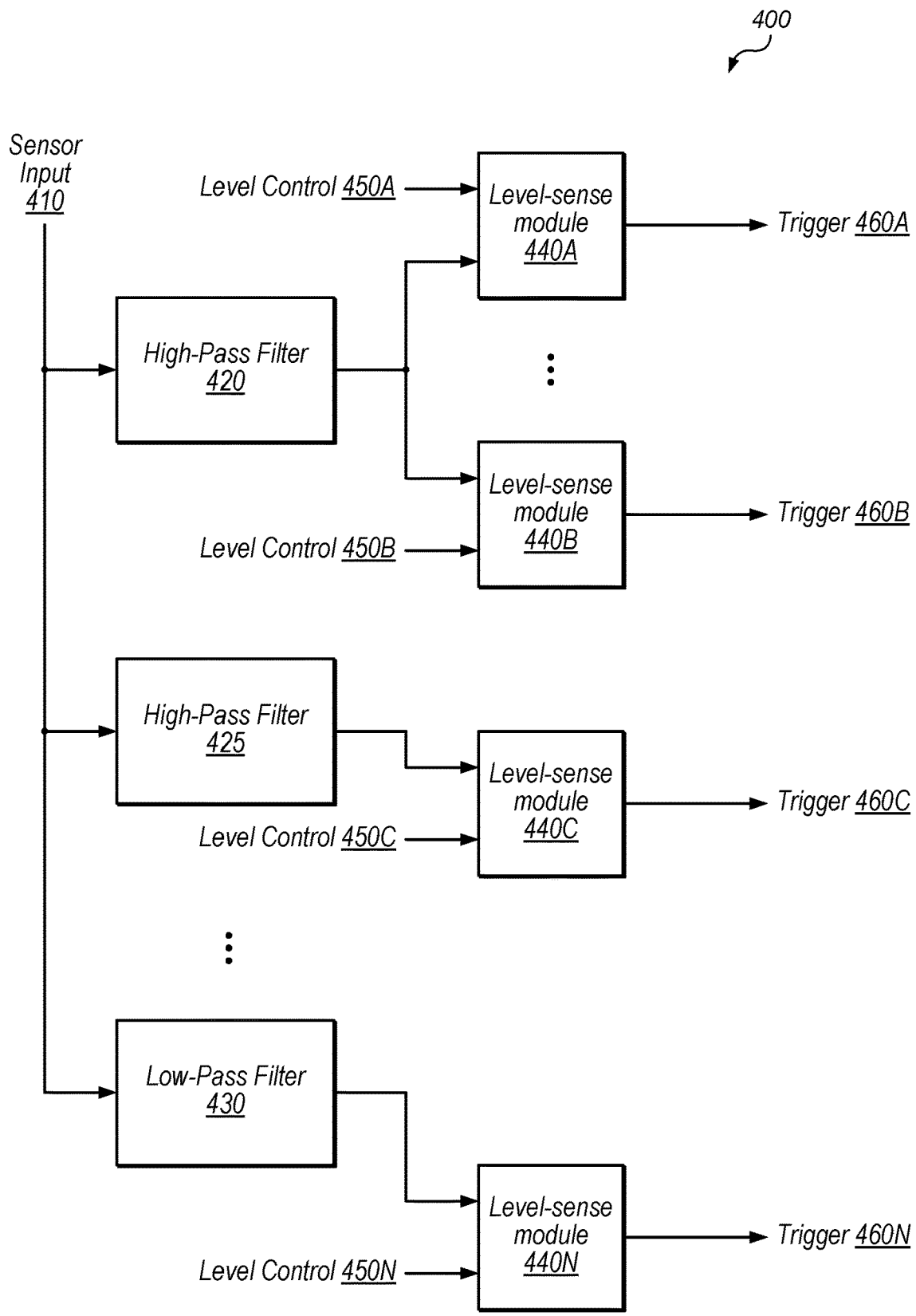
FIG. 4 is a block diagram illustrating an exemplary programmable sensor complex configured to detect different supply voltage events, according to some embodiments.

FIG. 4 is a block diagram illustrating an exemplary sensor complex 400 configured to output trigger signals, according to some embodiments. In some embodiments, PMU 120 and/or other circuit elements are configured to track the trigger signals and perform corrective actions in response to one or more pre-determined scenarios. In the illustrated embodiment, sensor complex 400 includes two high-pass filters 420 and 425, a low-pass filter 430, and level-sense modules 440A-440N. In other embodiments, any of various numbers of filters, level-sense modules, triggers, etc. may be implemented.

In some embodiments, high-pass filter 420 is configured to pass relatively high-frequency changes in supply voltage, e.g., for droop events 310 and 320 of FIG. 3A. Similarly, level-sense modules 440A and 440B may be configured (e.g., by level control signals 450A and 450B) to detect threshold supply voltage values corresponding to droop events 310 and 320 respectively. In such embodiments, trigger 460A may indicate detection of event 310 and trigger 460B may indicate detection of event 320.

Level-sense modules 440 may be implemented using any of various appropriate circuitry. In the illustrated embodiment, the threshold level sensed by a given module 440 is programmable using one of level control signals 450A-450N. By programming the reference levels, sensor complex 400 may be programmed to detect various different supply voltage events or combinations of events.

In some embodiments, high-pass filter 425 and level-sense module 440C are configured to detect load release event 330 and trigger 460C indicates that a potential load-release 430 has been detected. The cutoff frequency for high-pass filters 420 and 425 may be the same or may be different, depending on the types of events that these filters are configured to pass (and may be programmable).

In some embodiments, low-pass filter 430 is configured to remove high-frequency excursions of the supply voltage and trigger 460N indicates whether a longer-term voltage droop (e.g., the droop leading up to load release 330) is detected.

In some embodiments, control circuitry is configured to determine whether to initiate a corrective action based on detecting an appropriate combination of trigger assertions over time. For example, control circuitry may initiate a corrective action in response to a trigger corresponding to event 310, followed by a trigger corresponding to event 320, a trigger indicating a low voltage over a longer time interval, and a trigger corresponding to load release event 330. In other situations, any of various combinations of events or states may be detected. In these embodiments, the combination of multiple different sensors and/or triggers may reduce false positives so that corrective actions are not taken unnecessarily when a worst-case load release event is not actually a possibility, while ensuring that corrective action is taken when voltage margins are in fact reduced.

In various embodiments, detecting the load release and initiating a corrective action prior to the end of the voltage spike caused by the load release may eliminate or reduce the amount of ringing subsequent to the load release. Note that device 100 may also initiate other corrective actions prior to the load release event. For example, PMU 120 and/or adjustable clock circuitry 110 may reduce clock frequency in response to initial droop event 310 to reduce the magnitude of the second droop event 320. In some embodiments, the corrective action for the load release event may correspond to an even further reduction in frequency. In these embodiments, adjustable clock circuitry 110 is configured to generate output clock signals at multiple different frequency levels, e.g., based on control signaling from PMU 120. In other embodiments, control signaling for adjustable clock circuitry 110 may be generated by one or more other circuit elements in addition to or in place of PMU 120, including sensor(s) 130, sensor 134, or sensor block 400, for example.

Figure 5A:
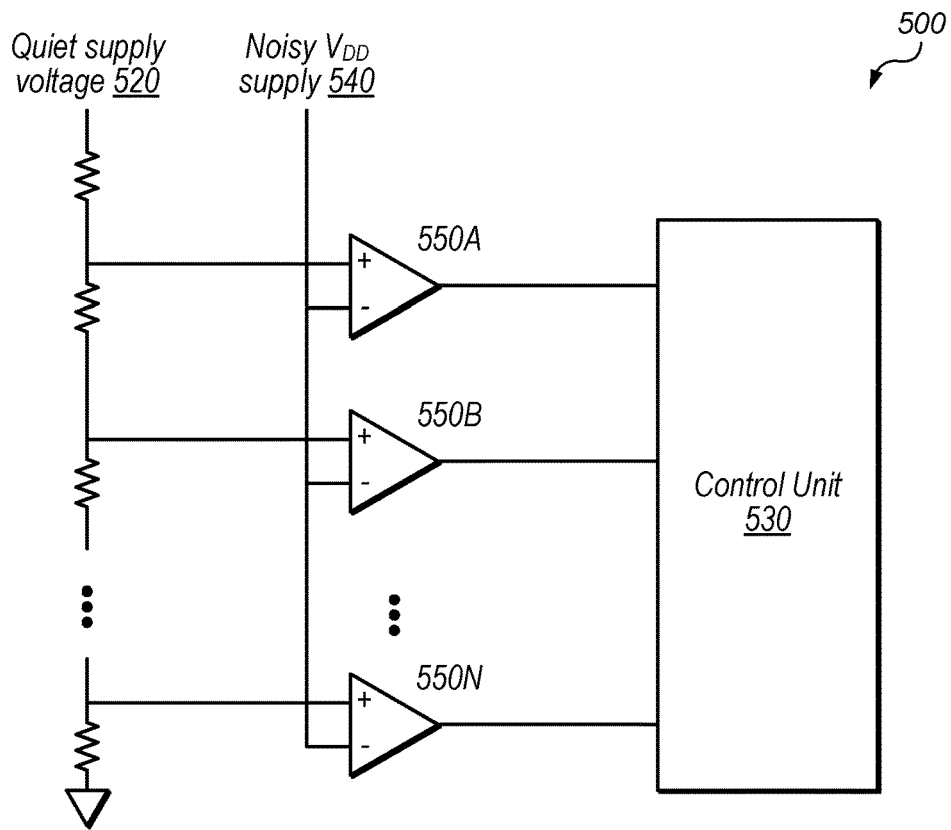
FIG. 5A is a block diagram illustrating an exemplary multi-level voltage sensor, according to some embodiments.

FIG. 5A is a block diagram illustrating an exemplary detector 500 configured to detect events relating to supply voltage, according to some embodiments. In the illustrated embodiment, detector 500 includes multiple comparators 550A-550N and a control unit 530. In the illustrated embodiment, a resistor ladder is powered by a quiet supply voltage 520 to provide different reference voltages for comparators 550A-550N. Quiet supply voltage 520 may be generated by a separate power supply (which may be an analog power supply), e.g., in order to reduce clock jitter. Comparators 550 are configured to compare noisy $V_{DD}$ supply 540 with respective ones of the reference voltages in order to detect particular supply voltage ranges.

Control unit 530, in some embodiments, is configured to initiate corrective actions in response to detection of supply voltage events. For example, control unit 530 may reduce the frequency of adjustable clock circuitry 110 in response to a reduction in supply voltage. In some embodiments, control unit 530 is configured to control adjustable clock circuitry 110 at multiple different frequencies in response to different supply voltage characteristics (e.g., based on detecting different supply voltage levels).

Figure 5B:
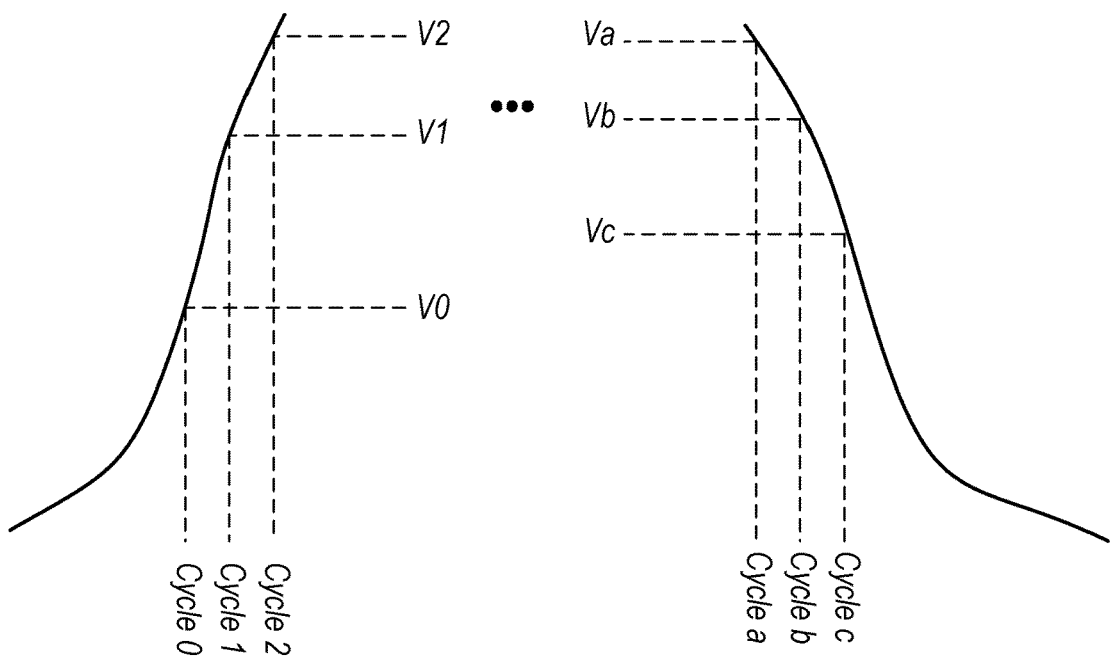
FIG. 5B is a plot of supply voltage over multiple cycles to illustrate exemplary situations detectable using a multi-cycle slope detector, according to some embodiments.

In some embodiments, control unit 530 is configured to detect change in supply voltage based on comparator outputs over multiple cycles. FIG. 5B illustrates a plot of supply voltage (e.g., of noisy $V_{DD}$ supply 540) over multiple cycles 0-2 on the left-hand side during an increase in voltage and cycles a-c on the right hand-side during a decrease in voltage. In the illustrated embodiment, the supply voltage has a value of V0 at the beginning of cycle 0, V1 at the beginning of cycle 1, and V2 at the beginning of cycle 2. In some embodiments, control unit 530 is configured to latch the outputs of comparators 550 at each cycle or over multiple cycles and store the results from one or more past cycles. Consider an exemplary situation in which the change to V1 triggers comparator 550B during cycle 0 and the change to V2 triggers comparator 550A during cycle 1. Based on detecting this situation, control unit 530 can determine that an increase in voltage with a slope greater than (reference voltage of comparator 550A—reference voltage of comparator 550B)/1 cycle. In some embodiments, control unit 530 is configured to determine whether various supply voltage events occurred based on comparator outputs over multiple clock cycles. Control unit 530 may be configured to store pre-determined patterns of comparator outputs over time that correspond to different voltage events such as events 310, 320, and/or 330 of FIG. 3A, for example. In some embodiments, the cycles correspond to clock cycles of a core clock, which typically has a frequency of greater than 1 GHz, for example. Therefore, the multi-cycle sensor may be able to detect significant slopes in supply voltage. In some embodiments, multi-cycle slope sensors are used in combination with other types of sensors.

Figure 6:
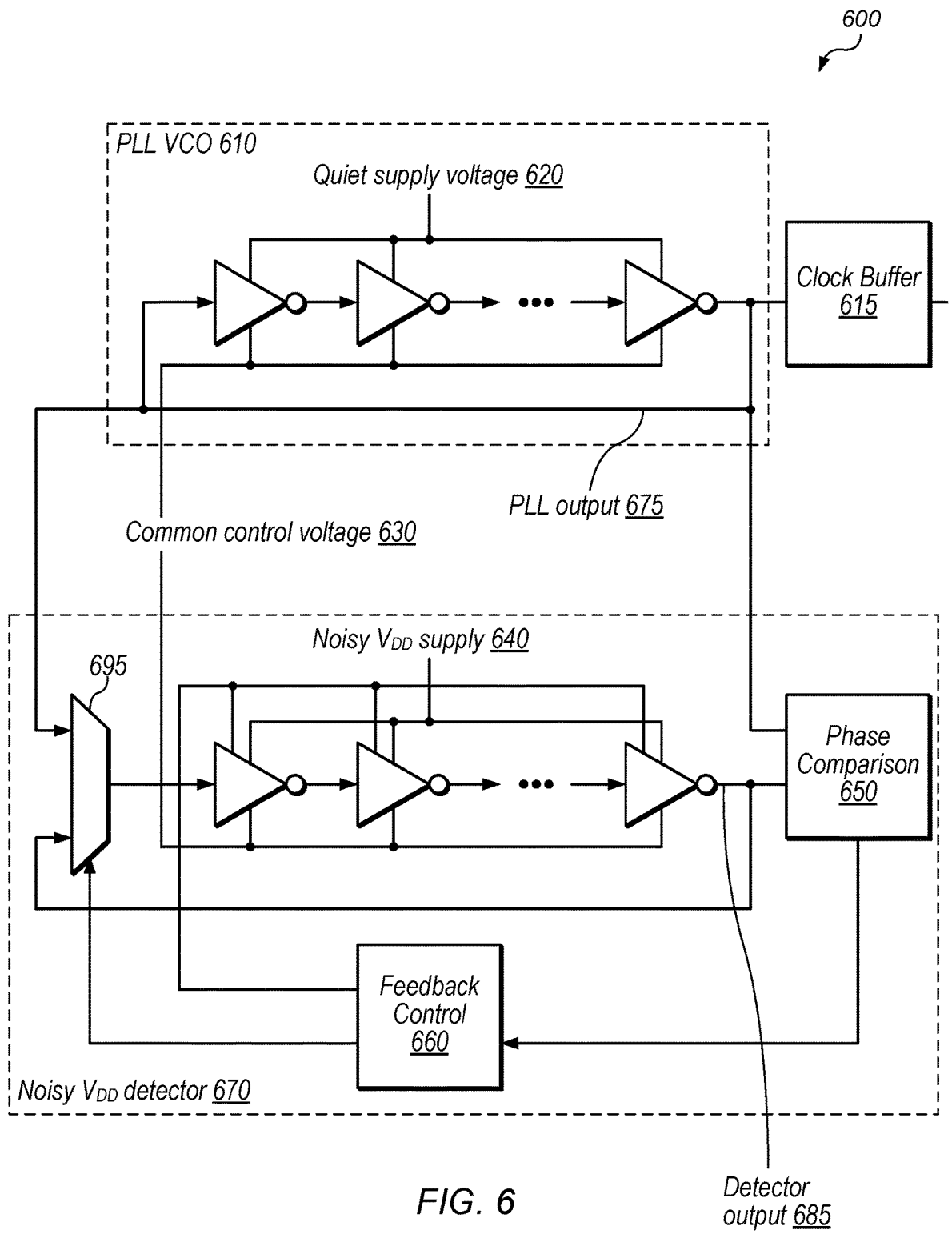
FIG. 6 is a block diagram illustrating an exemplary voltage-controlled oscillator (VCO)-based sensor for supply voltage, according to some embodiments.

FIG. 6 is a block diagram illustrating an exemplary coupled voltage controlled oscillator (VCO) detector 600, according to some embodiments. In the illustrated embodiment, a phase-locked loop includes PLL VCO 610 and is configured to provide a clock signal via clock buffer 615. Other common PLL elements such as a divider, reference clock, and feedback loop are not shown. In the illustrated embodiment, VCO 610 is implemented as a ring oscillator that includes an odd number of inverting delay elements. In other embodiments, other appropriate circuitry may be used to achieve oscillation. In some embodiments, The PLL is configured to adjust the frequency of VCO 610 by controlling common control voltage 630, which alters the delay imposed by each delay element, in some embodiments. In the illustrated embodiment, the PLL VCO 610 is powered by a quiet supply voltage 620. Quiet supply voltage 620 may be generated by a separate power supply (which may be an analog power supply), e.g., in order to reduce clock jitter. Therefore, the quiet supply voltage 620 may exhibit less noise than the noisy $V_{DD}$ supply 640 that is used to clock other portions of device 100.

In the illustrated embodiment, detector 600 also includes a noisy $V_{DD}$ detector portion 670. In some embodiments, detector portion 670 includes replicas of the delay elements in VCO 610, which are also controlled by common control voltage 630. The delay elements in detector portion 670, however, are powered by the noisy $V_{DD}$ supply 640. In the illustrated embodiment, detector portion 670 includes phase comparison circuitry 650 and feedback control circuitry 660 that are configured to determine difference in phase between the outputs of the two sets of delay elements.

In the illustrated embodiment, detector 600 is configured to detect certain conditions in the noisy $V_{DD}$ supply 640 based on phase difference detected by phase comparison circuitry 650. In the illustrated embodiment, MUX 695 is configured to provide either (1) the PLL output 675 to the delay elements of portion 670 or (2) detector output 685 to the input of these delay elements.

When the delay elements in portion 670 are receiving the PLL output signal 675, the phases between PLL output 675 and detector output 685 should be similar if the supply voltages 620 and 640 are similar and control voltage 630 is common, in embodiments in which the delay elements in 620 and 640 are matched. Therefore, phase comparison circuitry 650, in some embodiments, is configured to detect supply voltage perturbations in noisy $V_{DD}$ supply 640 relative to the quiet supply voltage 620 based on difference between the phases of these two signals. Comparison circuitry 650 may compare the difference in phase divided by N, where N is the number of delay elements. The phase difference may correspond to the magnitude and/or rate of changes in noisy $V_{DD}$ supply 640 and may be used to detect various supply voltage events such as load release event 330, for example. Feedback control circuitry 660 may allow for long term differences between the two loops to be compensated for such that detector 670 may be running at the same frequency and constant phase with respect to PLL VCO 610 when the supply is quiet, and only when there are significant noise events will phase comparison 650 show a difference between the phase position. In some embodiments the frequency response of detector 670 is tuned through feedback control 660 in order to achieve the balance of tracking between the two loops and sensitivity to noise signals.

In some embodiments, periodically, after MUX 695 has provided an edge from detector output 685, feedback control circuitry 660 is reconfigured to control MUX 695 to provide signals from PLL output signal 675 for multiple passes through the VCO cycle. This may be used to improve resolution of the detector by integrating any differences over the multiple passes to determine the difference in delay between PLL output 675 and detector output 685. For an iteration through "i" VCO cycles, the resolution may become the phase divided by (i times N). In these embodiments, after an event is detected, the detector may be reset by injecting a new edge from PLL output 675. This injection may help to maintain tracking between the two loops. The injection may occur every cycle, every other cycle, some other number of cycles, or a programmable number of cycles in various embodiments. In other embodiments, feedback control circuitry 660, MUX 695, and the feedback loop for detector output 685 may be omitted.

Sensors 400, 500, and 600 are included for purposes of illustration but are not intended to limit the scope of the present disclosure. In other embodiments, any of various appropriate sensors may be used in conjunction with and/or in place of disclosed sensors. In some embodiments, using different types of sensors for different supply voltage events may improve overall detection accuracy.

Exemplary Low Load Line Power Supply Mode

Figure 7:
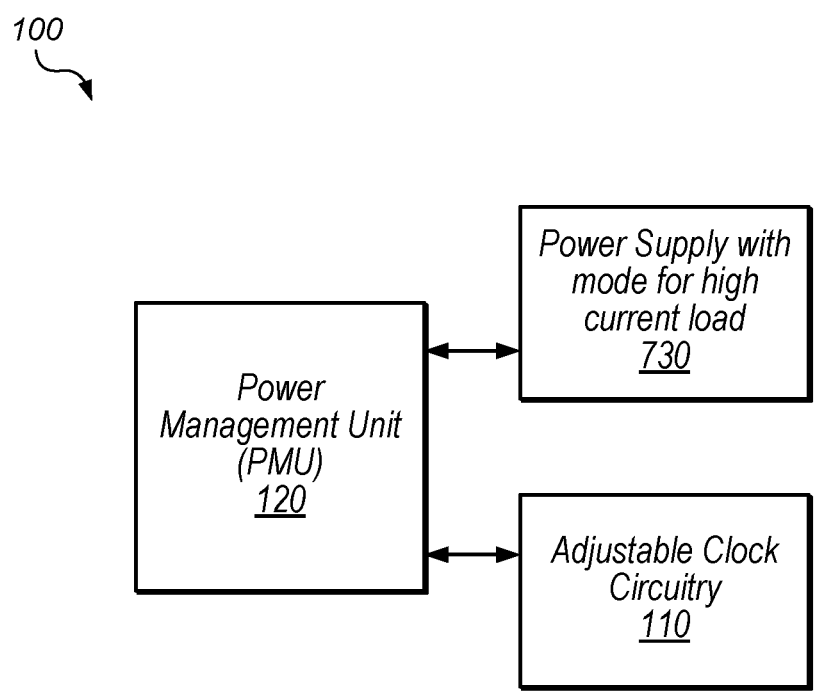
FIG. 7 is a block diagram illustrating a device that includes an exemplary power supply with a low load line mode for sustained high current loads, according to some embodiments.

FIG. 7 is a block diagram illustrating an example of device 100 that includes a power supply with a mode for improved margins with high current loads. In the illustrated embodiment, device 100 includes adjustable clock circuitry 110, PMU 120, and power supply 730. In some embodiments, adjustable clock circuitry 110 and PMU 120 are configured as described above with reference to FIG. 1. In some embodiments, PMU 120 is configured to use power supply 730 to compensate for longer-term droops in supply voltage while using adjustable clock circuitry 110 to handle higher-frequency transients in supply voltage.

Figure 8:
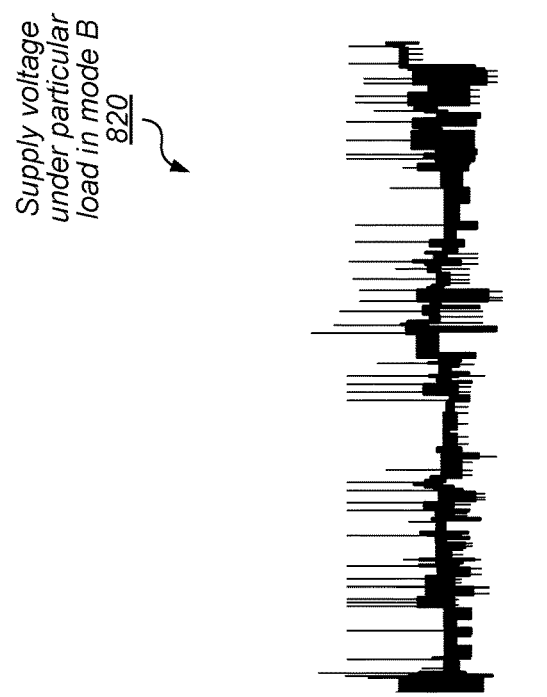
FIG. 8 is an exemplary plot of supply voltage during a voltage droop event for different power supply modes, according to some embodiments.
Figure 8:
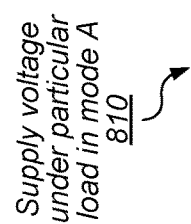

FIG. 8 illustrates exemplary plots of supply voltage during a voltage droop for a particular high current load and different power supply modes. Mode A, in the illustrated embodiment may be a normal operating mode while mode B may respond slowly with additional phases of current capability, effectively presenting a very small load line when under high current (e.g., values smaller than one mOhm, in some embodiments) to restore steady state voltage under high load currents. Mode B may be referred to as a "low load line" mode. Power supply 730 may be configured to enter mode B based on control signaling from or inside PMU 120 or in response to internally detecting high current load over a predetermined amount of time, for example. In the illustrated plot, Va corresponds to a normal supply voltage during operation under lesser current loads than those illustrated. In mode A, in the illustrated embodiment, the average supply voltage has dropped to roughly Vc on average during a voltage droop event. In mode B, in the illustrated embodiment, the average supply voltage has dropped to roughly Vb on average during a voltage droop event. As shown in the illustrated example, the low load line mode has a better average supply voltage relative to mode A under high current load conditions. The low load line mode, however, has greater amounts of higher frequency transients and transients of higher magnitude than mode A, in the illustrated example. Large transients (both negative and positive) may be undesirable, e.g., because they may damage equipment over time and/or cause computing errors.

In some embodiments, the transients in mode B can be greatly reduced by detecting steep slopes in the supply voltage (e.g., using one or more of the various sensors discussed above) and through migration by rapidly adjusting the frequency of adjustable clock circuitry 110, e.g., using the techniques discussed above and in U.S. patent application Ser. No. 15/146,374. In some embodiments, the combination of the adjustable clock circuitry 110 for high-frequency and mid-frequency transients and the low load line mode of power supply 730 for low frequency voltage changes may increase average supply voltage while reducing transients. In particular, in embodiments in which the ringing 340 subsequent to load release event 330 is detected and reduced, the combination of the low load line mode and the adjustable clock circuitry 110 may significantly improve the worst-case supply voltage of the device which may allow reduced voltage margins in a circuit design. In some embodiments the entire voltage setting may be reduced because of the reduced impact from high current droop (due to reduced load line) without affecting the minimum voltage the critical paths will experience. As discussed above, in some embodiments adjustable clock circuitry 110 mitigates the effect of high frequency noise (e.g., by providing more cycle time on the critical path) without actually reducing high-frequency noise. In these embodiments, the combination of low load line mode and adjustable clock circuitry 110 may also allow reduced voltage margins, e.g., because the low load line mode reduces the magnitude of long-term voltage droops while the adjustable clock circuitry 110 mitigates the effects of high-frequency transients.

In some embodiments, PMU 120 or another processing element is configured to adjust the frequency of adjustable clock circuitry 110 based on tracking the supply voltage. This may be particularly useful in cost-reduced or space constrained systems with low bypass capacitance or a PMU which is not sized for peak current behavior. In such systems, the supply voltage waveform may have a triangle or sine-wave behavior. By tracking the supply voltage over time, control circuitry may be configured to upshift or downshift the frequency of adjustable clock circuitry 110 in order to reduce the magnitude of the droop in the power supply. In these embodiments it may be important to detect the case where the supply voltage begins dropping and to ensure that the clock frequency is reduced in time. In some embodiments, the wave behavior of the supply voltage may be reduced using these techniques.

Exemplary Method

FIG. 9 is a flow diagram illustrating one exemplary embodiment of a method 900 for handling a load release event, according to some embodiments. The method shown in FIG. 9 may be used in conjunction with any of the computer systems, devices, elements, or components disclosed herein, among other devices. In various embodiments, some of the method elements shown may be performed concurrently, in a different order than shown, or may be omitted. Additional method elements may also be performed as desired. Flow begins at 910.

In other embodiments, the techniques of FIG. 9 are used to detect other supply voltage events such as an initial voltage droop 310 or 320, for example, or combinations of multiple supply voltage events. The discussion of load release events in FIG. 9 is for purposes of illustration and is not intended to limit the techniques of FIG. 9 to load release events.

At 910, in the illustrated embodiment, one or more sensors monitor a supply voltage from a power supply. The supply voltage may be directly supplied by the power supply or may be a derivation based on the power supply output. The monitoring may occur using multiple sensors which may be placed at multiple locations across a semiconductor device. The monitoring may be performed using multiple different types of sensors, which may include one or more types disclosed herein. Note that although various sensors herein are configured to measure voltage characteristics, other types of sensors may be used to determine voltage characteristics indirectly (e.g., using current sensors, etc.).

At 920, in the illustrated embodiment, control circuitry (e.g., PMU 120) detects a load release event that includes an increase in the supply voltage that meets one or more pre-determined threshold parameters. In other embodiments, similar techniques may be used to detect a droop event that includes a decrease in supply voltage that meets one or more pre-determined threshold parameters. In various embodiments, the parameters may include one or more threshold rates of change of the supply voltage. The parameters may include a magnitude of the decrease/increase, a value of the supply voltage prior to the increase, and/or a value of the supply voltage subsequent to the decrease/increase. The parameters may include one or more previous events (e.g., events 310 and/or 320) that should be detected before PMU 120 will determine that a load release event has occurred.

At 930, in the illustrated embodiment, control circuitry initiates a corrective action to increase clock cycle time for operations performed by circuitry powered by the supply voltage during a time interval. In the illustrated embodiment, the time interval corresponds to ringing of the supply voltage that reduces the supply voltage and results from the load release event. Said another way, the ringing of the supply voltage occurs during the time interval in which clock cycle time is increased, although the time interval during which the clock cycle is adjusted may extend beyond the ringing. This may avoid logic errors on one or more critical paths, for example, by providing circuitry with extra time in each clock cycle to perform operations when the circuitry is receiving a lower supply voltage.

In some embodiments, the corrective action may also reduce or control the ringing. For example, circuitry may have lower switching power consumption when the clock cycle time is increased. Controlling the ringing may include reducing the amount of the undershoot (relative to amount of the undershoot that would have occurred without the corrective action) or even eliminating the ringing. This may improve the worst-case supply voltage of device 100 which may allow for reduced voltage margins and lower overall power consumption, for example.

In some embodiments, the corrective action is a rapid decrease in clock frequency by adjustable clock circuitry 110. In other embodiments, any of various corrective actions may be implemented in conjunction with or in place of reduction in clock frequency.

Exemplary Device

Referring now to FIG. 10, a block diagram illustrating an exemplary embodiment of a device 1000 is shown. In some embodiments, elements of device 1000 may be included within a system on a chip. In some embodiments, device 1000 may be included in a mobile device, which may be battery-powered. Therefore, power consumption by device 1000 may be an important design consideration. In the illustrated embodiment, device 1000 includes fabric 1010, compute complex 1020 input/output (I/O) bridge 1080, cache/memory controller 1045, graphics unit 1050, and display unit 1065.

Fabric 1010 may include various interconnects, buses, MUX's, controllers, etc., and may be configured to facilitate communication between various elements of device 1000. In some embodiments, portions of fabric 1010 may be configured to implement various different communication protocols. In other embodiments, fabric 1010 may implement a single communication protocol and elements coupled to fabric 1010 may convert from the single communication protocol to other communication protocols internally.

In the illustrated embodiment, compute complex 1020 includes bus interface unit (BIU) 1025, cache 1030, and cores 1035 and 1040. In various embodiments, compute complex 1020 may include various numbers of processors, processor cores and/or caches. For example, compute complex 1020 may include 1, 2, or 4 processor cores, or any other suitable number. In one embodiment, cache 1030 is a set associative L2 cache. In some embodiments, cores 1035 and/or 1040 may include internal instruction and/or data caches. In some embodiments, a coherency unit (not shown) in fabric 1010, cache 1030, or elsewhere in device 1000 may be configured to maintain coherency between various caches of device 1000. BIU 1025 may be configured to manage communication between compute complex 1020 and other elements of device 1000. Processor cores such as cores 1035 and 1040 may be configured to execute instructions of a particular instruction set architecture (ISA) which may include operating system instructions and user application instructions.

Cache/memory controller 1045 may be configured to manage transfer of data between fabric 1010 and one or more caches and/or memories. For example, cache/memory controller 1045 may be coupled to an L3 cache, which may in turn be coupled to a system memory. In other embodiments, cache/memory controller 1045 may be directly coupled to a memory. In some embodiments, cache/memory controller 1045 may include one or more internal caches.

As used herein, the term "coupled to" may indicate one or more connections between elements, and a coupling may include intervening elements. For example, in FIG. 10, graphics unit 1050 may be described as "coupled to" a memory through fabric 1010 and cache/memory controller 1045. In contrast, in the illustrated embodiment of FIG. 10, graphics unit 1050 is "directly coupled" to fabric 1010 because there are no intervening elements.

Graphics unit 1050 may include one or more processors and/or one or more graphics processing units (GPU's). Graphics unit 1050 may receive graphics-oriented instructions, such as OPENGL®, Metal, or DIRECT3D® instructions, for example. Graphics unit 1050 may execute specialized GPU instructions or perform other operations based on the received graphics-oriented instructions. Graphics unit 1050 may generally be configured to process large blocks of data in parallel and may build images in a frame buffer for output to a display. Graphics unit 1050 may include transform, lighting, triangle, and/or rendering engines in one or more graphics processing pipelines. Graphics unit 1050 may output pixel information for display images. In the some embodiments, graphics unit 1050 includes a programmable shader core.

Display unit 1065 may be configured to read data from a frame buffer and provide a stream of pixel values for display. Display unit 1065 may be configured as a display pipeline in some embodiments. Additionally, display unit 1065 may be configured to blend multiple frames to produce an output frame. Further, display unit 1065 may include one or more interfaces (e.g., MIPI® or embedded display port (eDP)) for coupling to a user display (e.g., a touchscreen or an external display).

I/O bridge 1080 may include various elements configured to implement: universal serial bus (USB) communications, security, audio, and/or low-power always-on functionality, for example. I/O bridge 1080 may also include interfaces such as pulse-width modulation (PWM), general-purpose input/output (GPIO), serial peripheral interface (SPI), and/or inter-integrated circuit (I2C), for example. Various types of peripherals and devices may be coupled to device 1000 via I/O bridge 1080.

In some embodiments, various elements of device 1000 are powered by power supply 710 and/or clocked by adjustable clock circuitry 110. The disclosed techniques may reduce switching power consumption in device 1000, prevent damage to components of device 1000, etc.

Exemplary Computer-Readable Medium

The present disclosure has described various exemplary circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

FIG. 11 is a block diagram illustrating an exemplary non-transitory computer-readable storage medium that stores circuit design information, according to some embodiments. In the illustrated embodiment, semiconductor fabrication system 1120 is configured to process the design information 1115 stored on non-transitory computer-readable medium 1110 and fabricate integrated circuit 1130 based on the design information 1115.

Non-transitory computer-readable medium 1110, may comprise any of various appropriate types of memory devices or storage devices. Medium 1110 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Medium 1110 may include other types of non-transitory memory as well or combinations thereof. Medium 1110 may include two or more memory mediums which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabrication at least a portion of integrated circuit 1130. The format of design information 1115 may be recognized by at least one semiconductor fabrication system 1120. In some embodiments, design information 1115 may also include one or more cell libraries which specify the synthesis and/or layout of integrated circuit 1130. In some embodiments, the design information is specified in whole or in part in the form of a netlist that specifies cell library elements and their connectivity.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown in FIGS. 1-2, 4-7, and/or 10. Further, integrated circuit 1130 may be configured to perform various functions described herein in conjunction with other components. For example, integrated circuit 1130 may be coupled to voltage supply circuitry that is configured to provide a supply voltage (e.g., as opposed to including a voltage supply itself). Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    sensor circuitry configured to:
        monitor one or more characteristics of a supply voltage received from an output of a power supply; and
        detect an event corresponding to a change, in at least one of the one or more monitored characteristics of the supply voltage, that meets one or more pre-determined threshold supply voltage change parameters, wherein, to detect the event, the sensor circuitry is configured to compare outputs of a first voltage-controlled oscillator (VCO) powered by the supply voltage and a second VCO powered by a second supply voltage; and
    control circuitry configured to, in response to detection of the event by the sensor circuitry, initiate a corrective action to increase clock cycle time, during a time interval, for one or more operations performed by other circuitry while powered by the supply voltage.

2. The apparatus of claim 1, further comprising filter circuitry configured to filter measurements of the supply voltage, based on frequency, for comparison.

3. The apparatus of claim 1,
    wherein the sensor circuitry includes phase comparison circuitry configured to determine a difference in phase between the outputs of the first VCO and the second VCO.

4. The apparatus of claim 1, wherein the other circuitry is a processor configured to perform the one or more operations based on execution of program instructions while powered by the supply voltage.

5. The apparatus of claim 1, wherein the one or more pre-determined threshold parameters are associated with a load release event and wherein the control circuitry is configured to increase the clock cycle time prior to ringing of the supply voltage that results from the load release event and reduces the supply voltage.

6. The apparatus of claim 1, wherein the one or more characteristics include an increase in supply voltage that exceeds a threshold rate and threshold magnitude.

7. The apparatus of claim 1, wherein the apparatus is configured to control the power supply to increase current supply in response to detecting the event.

8. The apparatus of claim 1,
    wherein the first VCO includes multiple inverters powered by the supply voltage and wherein the other VCO includes multiple inverters powered by the second supply voltage; and
    wherein the sensor circuitry is configured to detect the event based on differences in phase between the first and second VCOs over multiple passes through the inverters of the first VCO.

9. The apparatus of claim 1, wherein the event corresponds to the supply voltage meeting a noise threshold.

10. A method, comprising:
    monitoring, by sensor circuitry, one or more characteristics of a supply voltage received from a power supply output;
    detecting, using the sensor circuitry, an event corresponding to a change in at least one of the one or more monitored characteristics of the supply voltage that meets one or more pre-determined threshold supply voltage change parameters, wherein the detecting includes comparing outputs of a first voltage-controlled oscillator (VCO) powered by the supply voltage and a second VCO powered by a second supply voltage; and
    initiating a corrective action to increase clock cycle time, during a time interval, for one or more operations performed by other circuitry while powered by the supply voltage, wherein the initiating is performed by control circuitry in response to detection of the event by the sensor circuitry.

11. The method of claim 10, wherein the monitoring includes:
    monitoring for multiple different voltage level thresholds of the supply voltage;
    wherein the detecting the event is based on occurrence of voltage levels of the supply voltage that meet the multiple different voltage level thresholds.

12. The method of claim 10, wherein the monitoring includes storing outputs of a comparator circuit over multiple cycles and detecting the event based on the stored outputs.

13. The method of claim 10, wherein the detecting includes determining differences in phase between the outputs of the first VCO and the second VCO over multiple passes through similar circuitry respectively powered by the first VCO and second VCO.

14. A non-transitory computer readable storage medium having stored thereon design information that specifies a design of at least a portion of a hardware integrated circuit in a format recognized by a semiconductor fabrication system that is configured to use the design information to produce the circuit according to the design, including:
    sensor circuitry configured to:
        monitor one or more characteristics of a supply voltage received from an output of a power supply; and
        detect an event corresponding to a change, in at least one of the one or more monitored characteristics of the supply voltage, that meets one or more pre-determined threshold supply voltage change parameters, wherein, to detect the event, the sensor circuitry is configured to compare outputs of a first voltage-controlled oscillator (VCO) powered by the supply voltage and a second VCO powered by a second supply voltage; and
    control circuitry configured to, in response to detection of the event by the sensor circuitry, initiate a corrective action to increase clock cycle time, during a time interval, for one or more operations performed by other circuitry while powered by the supply voltage.

15. The non-transitory computer readable storage medium of claim 14,
wherein the sensor circuitry is further configured to:
monitor for multiple different voltage level thresholds of the supply voltage; and
detect the event based on occurrence of voltage levels of the supply voltage that meet the multiple different voltage level thresholds; and
wherein the sensor circuitry includes:
reference circuitry configured to generate multiple reference voltages corresponding to the different voltage level thresholds;
a first comparator circuit configured to compare the supply voltage with a first reference voltage; and
a second comparator circuit configured to compare the supply voltage with a second reference voltage.

16. The non-transitory computer readable storage medium of claim 14,
wherein the sensor circuitry includes phase comparison circuitry configured to determine a difference in phase between the outputs of the first VCO and the second VCO;
wherein the first VCO includes multiple inverters powered by the supply voltage and wherein the other VCO includes multiple inverters powered by the second supply voltage; and
wherein the sensor circuitry is configured to detect the event based on differences in phase between the first and second VCOs over multiple passes through the inverters of the first VCO.

17. An apparatus, comprising:
sensor circuitry configured to:
monitor one or more characteristics of a supply voltage received from an output of a power supply including to monitor for multiple different voltage level thresholds of the supply voltage based on comparison with voltage level thresholds generated based on a different supply voltage; and
detect an event corresponding to a change, in at least one of the one or more monitored characteristics of the supply voltage, that meets one or more predetermined threshold supply voltage change parameters, including based on occurrence of voltage levels of the supply voltage that meet the multiple different voltage level thresholds; and
control circuitry configured to, in response to detection of the event by the sensor circuitry, initiate a corrective action to increase clock cycle time, during a time interval, for one or more operations performed by other circuitry while powered by the supply voltage.

18. The apparatus of claim 17, wherein the sensor circuitry includes reference circuitry configured to generate multiple reference voltages using a resistor ladder.

19. The apparatus of claim 17, wherein the sensor circuitry is configured to detect the event based on stored results of comparisons with the multiple different voltage level thresholds over multiple cycles.

20. The apparatus of claim 17, further comprising filter circuitry configured to filter measurements of the supply voltage for comparison with at least one of the voltage level thresholds.

21. The apparatus of claim 17, wherein at least one of the multiple different voltage level thresholds is programmable.

* * * * *